(12) United States Patent
Sekine et al.

(10) Patent No.: US 11,264,968 B2
(45) Date of Patent: Mar. 1, 2022

(54) HIGH-FREQUENCY DEVICE AND MULTIPLEXER

(71) Applicant: TAIYO YUDEN CO., LTD., Tokyo (JP)

(72) Inventors: Hideyuki Sekine, Tokyo (JP); Hosung Choo, Tokyo (JP); Makoto Inoue, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 74 days.

(21) Appl. No.: 16/721,268

(22) Filed: Dec. 19, 2019

(65) Prior Publication Data

US 2020/0252044 A1  Aug. 6, 2020

(30) Foreign Application Priority Data

Feb. 1, 2019  (JP) .............................. JP2019-017367

(51) Int. Cl.
*H03H 9/05* (2006.01)
*H05K 1/16* (2006.01)
(Continued)

(52) U.S. Cl.
CPC .............. *H03H 9/059* (2013.01); *H03H 3/08* (2013.01); *H03H 9/6406* (2013.01); *H03H 9/72* (2013.01); *H05K 1/0243* (2013.01); *H05K 1/0266* (2013.01); *H05K 1/111* (2013.01); *H05K 1/162* (2013.01); *H05K 1/165* (2013.01); *H05K 3/341* (2013.01); *H05K 3/368* (2013.01); *H05K 3/4007* (2013.01); *H01L 41/0477* (2013.01);
(Continued)

(58) Field of Classification Search
CPC ....... H03H 9/54–72; H03H 9/05–0595; H05K 1/11–119; H05K 1/0243; H05K 1/0266; H05K 1/16–165
See application file for complete search history.

(56) References Cited

U.S. PATENT DOCUMENTS 6,919,777 B2 * 7/2005 Taniguchi ............ H03H 9/0557
333/133
7,289,008 B2 * 10/2007 Kuroki ................. H03H 9/725
333/133
(Continued)

FOREIGN PATENT DOCUMENTS

JP  7-297665 A  11/1995
JP  2014-14131 A  1/2014
(Continued)

*Primary Examiner* — Dean O Takaoka
*Assistant Examiner* — Alan Wong
(74) *Attorney, Agent, or Firm* — Stein IP, LLC

(57) ABSTRACT

A high-frequency device includes: a circuit substrate including dielectric layers that are stacked, wiring patterns located on at least one of the dielectric layers, and a passive element formed of at least one of the wiring patterns, the circuit substrate having a first surface that is a surface of an outermost dielectric layer in a stacking direction of the dielectric layers; a terminal for connecting the high-frequency device to an external circuit, the terminal being located on the first surface and electrically connected to the passive element through a first path in the circuit substrate; and an acoustic wave element located on the first surface and electrically connected to the passive element through a second path in the circuit substrate.

12 Claims, 15 Drawing Sheets

(51) Int. Cl.
*H05K 1/11* (2006.01)
*H03H 9/64* (2006.01)
*H05K 1/02* (2006.01)
*H03H 9/72* (2006.01)
*H03H 3/08* (2006.01)
*H05K 3/34* (2006.01)
*H05K 3/40* (2006.01)
*H05K 3/36* (2006.01)
*H03H 9/02* (2006.01)
*H03H 9/145* (2006.01)
*H01L 41/047* (2006.01)

(52) U.S. Cl.
CPC ..... *H03H 9/02637* (2013.01); *H03H 9/02834* (2013.01); *H03H 9/14541* (2013.01); *H03H 9/14544* (2013.01); *H05K 2201/09936* (2013.01)

(56) References Cited

U.S. PATENT DOCUMENTS

| | | | |
|---|---|---|---|
| 7,795,728 B2* | 9/2010 | Przadka | H03H 9/0542 |
| | | | 257/724 |
| 8,230,563 B2 | 7/2012 | Tsuda | 29/25.35 |
| 9,923,543 B2* | 3/2018 | Sugaya | H03H 7/38 |
| 10,651,822 B2* | 5/2020 | Takamine | H03H 9/0576 |
| 2018/0226952 A1 | 8/2018 | Tanaka et al. | |

FOREIGN PATENT DOCUMENTS

| | | |
|---|---|---|
| JP | 2014-239379 A | 12/2014 |
| JP | 2018-129680 A | 8/2018 |
| JP | 2018-129683 A | 8/2018 |

* cited by examiner

HIGH-FREQUENCY DEVICE AND MULTIPLEXER

CROSS-REFERENCE TO RELATED APPLICATION

This application is based upon and claims the benefit of priority of the prior Japanese Patent Application No. 2019-017367, filed on Feb. 1, 2019, the entire contents of which are incorporated herein by reference.

FIELD

A certain aspect of the present embodiments relates to a high-frequency device and a multiplexer.

BACKGROUND

There has been known a filter in which an acoustic wave resonator is provided to an LC circuit formed of a capacitor and an inductor as disclosed in, for example, Japanese Patent Application Publication Nos. 2018-129680 and 2018-129683 (hereinafter, referred to as Patent Documents 1 and 2, respectively). It has been known to mount an acoustic wave element on a circuit substrate as disclosed in, for example, Japanese Patent Application Publication No. 2014-14131 (hereinafter, referred to as a Patent Document 3).

SUMMARY OF THE INVENTION

According to a first aspect of the present embodiments, there is provided a high-frequency device including: a circuit substrate including dielectric layers that are stacked, wiring patterns located on at least one of the dielectric layers, and a passive element formed of at least one of the wiring patterns, the circuit substrate having a first surface that is a surface of an outermost dielectric layer in a stacking direction of the dielectric layers; a terminal for connecting the high-frequency device to an external circuit, the terminal being located on the first surface and electrically connected to the passive element through a first path in the circuit substrate; and an acoustic wave element located on the first surface and electrically connected to the passive element through a second path in the circuit substrate.

According to a second aspect of the present embodiments, there is provided a multiplexer including the above high-frequency device.

DETAILED DESCRIPTION

When an acoustic wave element is embedded in a circuit substrate, the acoustic wave element deteriorates due to the heat and pressure generated when the circuit substrate is formed. When an acoustic wave element is mounted on the upper surface of the circuit substrate, the acoustic wave element may be broken by impact.

Hereinafter, a description will be given of embodiments with reference to the accompanying drawings.

First Embodiment

Figure 1:
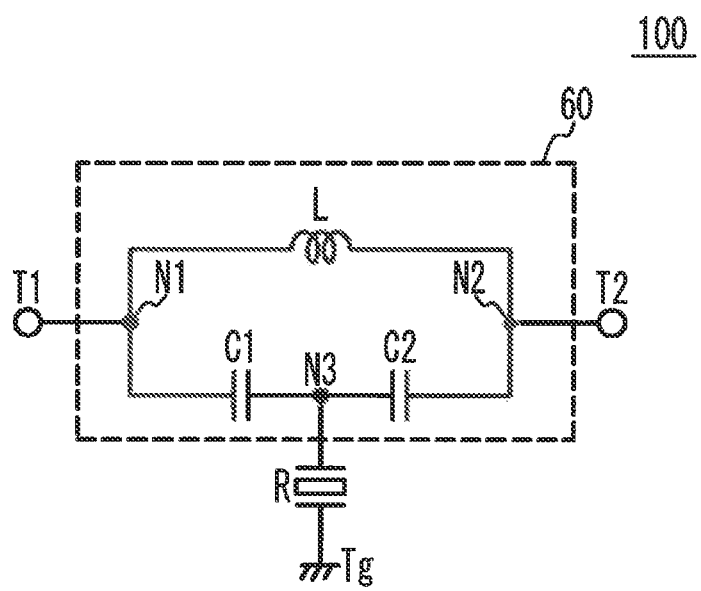
FIG. 1 is a circuit diagram of a high-frequency device in accordance with a first embodiment.

A first embodiment is an exemplary filter as a high-frequency device. FIG. 1 is a circuit diagram of a high-frequency device in accordance with the first embodiment. As illustrated in FIG. 1, a high-frequency device 100 in accordance with the first embodiment includes a resonant circuit 60 and an acoustic wave resonator R. The resonant circuit 60 includes capacitors C1 and C2 and an inductor L. The capacitors C1 and C2 are connected in series between terminals T1 and T2. The inductor L is connected in parallel to the capacitors C1 and C2 between a node N1, which is located between the terminal T1 and the capacitor C1, and a node N2, which is located between the terminal T2 and the capacitor C2. A first end of the acoustic wave resonator R is connected to a node N3 between the capacitors C1 and C2, and a second end of the acoustic wave resonator R is connected to a ground terminal Tg.

The high-frequency device 100 functions as a low-pass filter or a high-pass filter. The high-frequency device 100 transmits signals in the passband to the terminal T2 among high-frequency signals input to the terminal T1, and suppresses signals in other bands. For example, the capacitances of the capacitors C1 and C2 are configured to be 5.5 pF, the inductance of the inductor L is configured to be 1.5 nH, the resonant frequency of the acoustic wave resonator R is configured to be 2.26 GHz, and the antiresonant frequency of the acoustic wave resonator R is configured to be 2.33 GHz. This configuration causes the high-frequency device 100 to function as a low-pass filter having a passband that is a frequency band lower than the resonant frequency.

For example, the capacitances of the capacitors C1 and C2 are configured to be 7.1 pF, the inductance of the inductor L is configured to be 2 nH, the resonant frequency of the acoustic wave resonator R is configured to be 2.26 GHz, and the antiresonant frequency of the acoustic wave resonator R is configured to be 2.33 GHz. This configuration causes the high-frequency device 100 to function as a high-pass filter having a passband that is a frequency band higher than the resonant frequency. A filter having steep transition from the passband to the stopband is achieved by configuring the resonant frequency of the acoustic wave resonator to be located near the passband.

Figure 2:
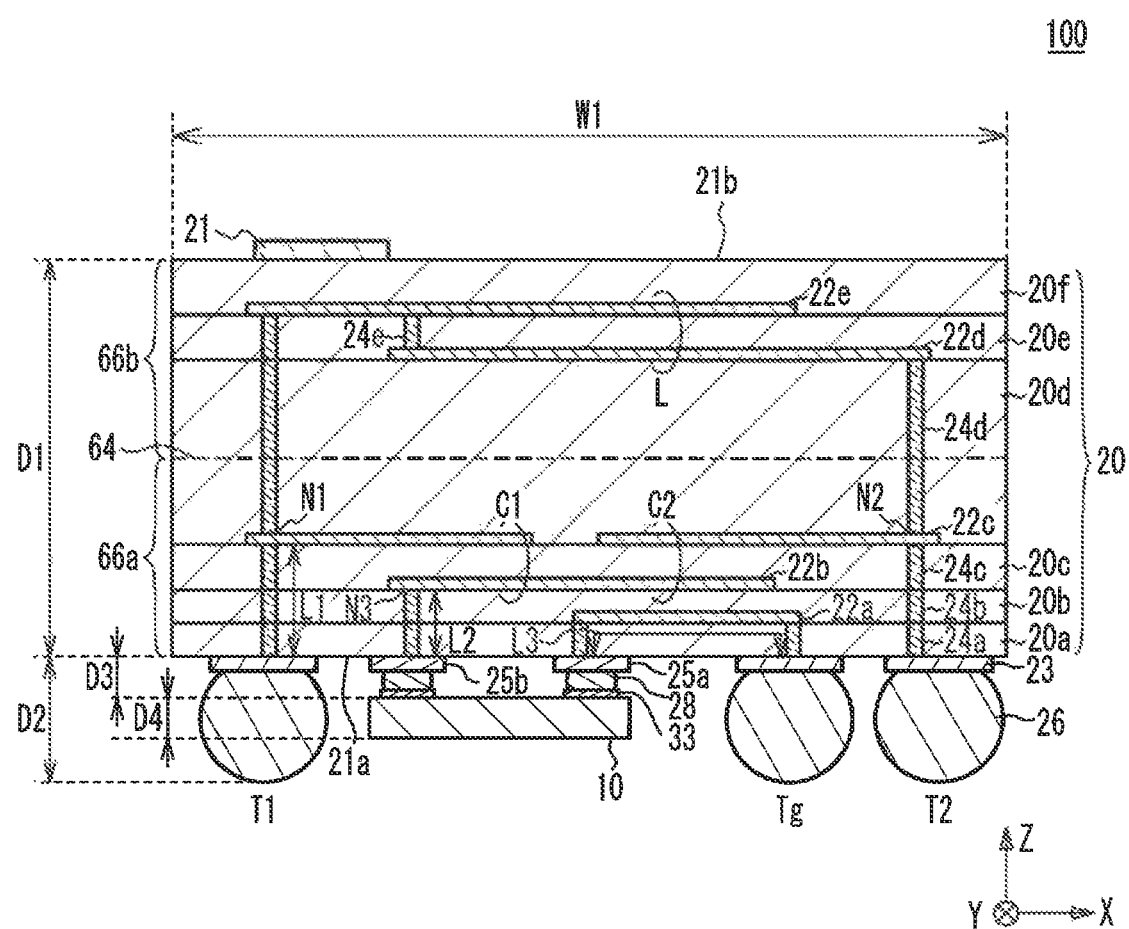
FIG. 2 is a cross-sectional view of a filter in accordance with the first embodiment.

FIG. 2 is a cross-sectional view of the filter in accordance with the first embodiment. As illustrated in FIG. 2, the direction in which dielectric layers 20a to 20f are stacked (the stacking direction of the dielectric layers 20a to 20f) is defined as a Z direction, and the planar directions of the dielectric layers 20a to 20f are defined as an X direction and a Y direction. In a circuit substrate 20, the dielectric layers 20a to 20f are stacked in the Z direction. The lower surface of the dielectric layer 20a is a lower surface 21a (i.e., a first surface that is a surface of the outermost dielectric layer of the dielectric layers 20a to 20f in the Z direction) of the circuit substrate 20, and the upper surface of the dielectric layer 20f is an upper surface 21b (i.e., a second surface that is an opposite surface of the circuit substrate 20 from the lower surface 21a) of the circuit substrate 20. A region 66a is a first region located closer to the lower surface 21a than a center 64 in the Z direction in the circuit substrate 20, and a region 66b is a second region located closer to the upper surface 21b than the center 64.

Wiring patterns 22a to 22e are respectively located on the dielectric layers 20a to 20e. Via wirings 24a to 24e respectively penetrating through the dielectric layers 20a to 20e are provided. A direction identification mark 21 is provided on the upper surface 21b of the circuit substrate 20. Terminals 23, 25a, and 25b are located on the lower surface 21a of the circuit substrate 20. The terminals 23 include the terminals T1 and T2 and the ground terminal Tg. Bumps 26 are located on the terminals 23. Terminals 33 of an acoustic wave element 10 are bonded to the terminals 25a and 25b through bumps 28. This structure mounts the acoustic wave element 10 on the terminals 25a and 25b.

The wiring patterns 22b and 22c face each other across the dielectric layer 20c. This structure allows the wiring patterns 22b and 22c and the dielectric layer 20c to form the capacitors C1 and C2. The wiring patterns 22d and 22e form the inductor L. The capacitors C1 and C2 are located in the region 66a in the circuit substrate 20, and the inductor L is located in the region 66b of the circuit substrate 20.

The capacitors C1 and C2 are electrically connected to the terminals T1 and T2 through the wiring patterns 22c and the via wirings 24a to 24c. The inductor L is electrically connected to the terminals T1 and T2 through the via wirings 24a to 24e. A node to which the wiring patter 22c, and the via wirings 24a to 24c connected to the terminal T1 connect is the node N1, and a node to which the wiring patter 22c, and the via wirings 24a to 24c connected to the terminal T2 connect is the node N2. A path L1 is a path connecting the node N1 and the terminal T1.

The capacitors C1 and C2 are electrically connected to the terminal 25b through the via wirings 24a and 24b. The terminal 25a is electrically connected to the ground terminal Tg through the via wiring 24a and the wiring patter 22a. A node to which the wiring pattern 22b, and the via wirings 24a and 24b connected to the terminal 25b connect is the node N3. A path L2 is a path connecting the node N3 and the terminal 25b. A path L3 is a path connecting the terminal 25a and the ground terminal Tg.

The dielectric layers 20a to 20f are made of an inorganic insulating material such as, but not limited to, a ceramic material or an organic insulating material such as, but not limited to, resin. The dielectric layers 20a to 20f contain an oxide of silicon (Si), calcium (Ca), and magnesium (Mg) (for example, diopside ($CaMgSi_2O_6$)) as a main component. The wiring patterns 22a to 22e, the terminals 23, 25a, and 25b, and the direction identification mark 21 are formed of metal layers containing, for example, silver (Ag), palladium (Pd), platinum (Pt), copper (Cu), nickel (Ni), gold (Au), a gold-palladium alloy, or a silver-platinum alloy. The terminals 23, 25a, and 25b and the direction identification mark 21 may include a plated layer made of nickel or the like on the aforementioned metal layer. The bumps 26 and 28 are metal bumps such as, but not limited to, solder bumps, gold bumps, or copper bumps. The terminals 23 and the bumps 26 function as terminals for connecting the circuit substrate 20 to an external element.

Exemplary dimensions are as follows. The thickness D1 of the circuit substrate 20 is 0.4 mm, the distance D2 between the lower surface of the circuit substrate 20 and the lower surface of the bump 26 is 0.3 mm, the distance D3 between the lower surface of the circuit substrate 20 and the upper surface of the acoustic wave element 10 is 0.02 mm, the height D4 of the acoustic wave element 10 is 0.1 mm, and the width W1 of the circuit substrate 20 is 2.5 mm. Since D2 is greater than D3+D4, the acoustic wave element 10 is protected by the bumps 26. The dielectric layers 20a to 20f are, for example, 6 layers to 12 layers.

Figure 3A:
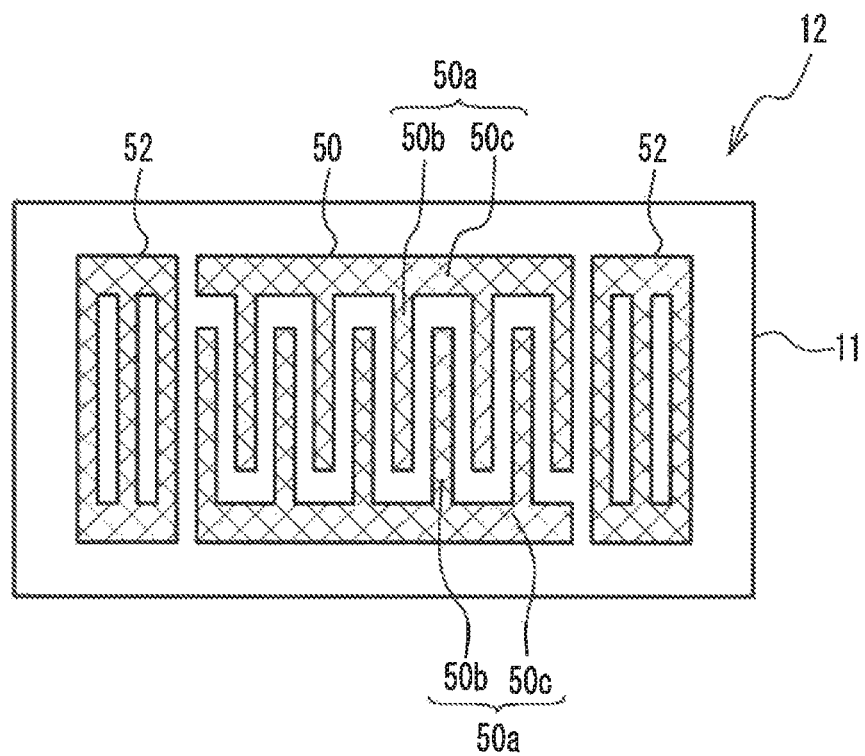
FIG. 3A is a plan view of an acoustic wave resonator in accordance with the first embodiment.
Figure 3B:
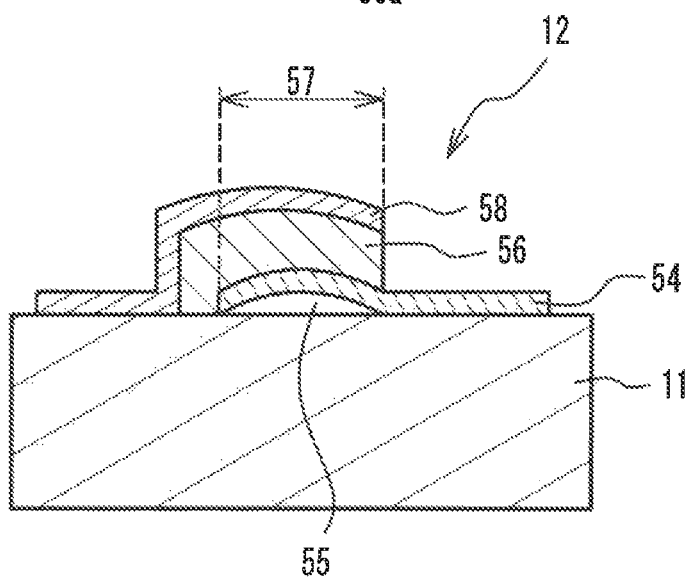
FIG. 3B is a cross-sectional view of another acoustic wave resonator in accordance with the first embodiment.

FIG. 3A is a plan view of an acoustic wave resonator in the first embodiment, and FIG. 3B is a cross-sectional view of another acoustic wave resonator of the first embodiment. In the example of FIG. 3A, the acoustic wave resonator 12 is a surface acoustic wave resonator. An interdigital transducer (IDT) 50 and reflectors 52 are located on the upper surface of the substrate 11. The IDT 50 includes a pair of comb-shaped electrodes 50a facing each other. The comb-shaped electrode 50a Includes electrode fingers 50b and a bus bar 50c connecting the electrode fingers 50b. The reflectors 52 are located at both sides of the IDT 50. The IDT 50 excites the surface acoustic wave in the substrate 11. The substrate 11 is a piezoelectric substrate such as, but not limited to, a lithium tantalate substrate, a lithium niobate substrate, or a crystal substrate. The substrate 11 may be a composite substrate in which a piezoelectric substrate is bonded on a support substrate such as, but not limited to, a sapphire substrate, a spinel substrate, an alumina substrate, a crystal substrate, or a silicon substrate. An insulating film such as a silicon oxide film or an aluminum nitride film may be located between the support substrate and the piezoelectric substrate. The IDT 50 and the reflectors 52 are formed of, for example, an aluminum film or a copper film. A protective film or a temperature compensation film may be located on the substrate 11 so as to cover the IDT 50 and the reflectors 52.

In the example of FIG. 3B, the acoustic wave resonator 12 is a piezoelectric thin film resonator. A piezoelectric film 56 is located on the substrate 11. A lower electrode 54 and an upper electrode 58 are provided so as to sandwich the piezoelectric film 56 between them. An air gap 55 is formed between the lower electrode 54 and the substrate 11. The region where the lower electrode 54 and the upper electrode 58 face each other across at least a part of the piezoelectric film 56 is a resonance region 57. The lower electrode 54 and the upper electrode 58 in the resonance region 57 excite the acoustic wave in the thickness extension mode in the piezoelectric film 56. The substrate 11 is, for example, a sapphire substrate, a spinel substrate, an alumina substrate, a glass substrate, a crystal substrate, or a silicon substrate. The lower electrode 54 and the upper electrode 58 are formed of a metal film such as, but not limited to, a ruthenium film. The piezoelectric film 56 is, for example, an aluminum nitride film.

Figure 4:
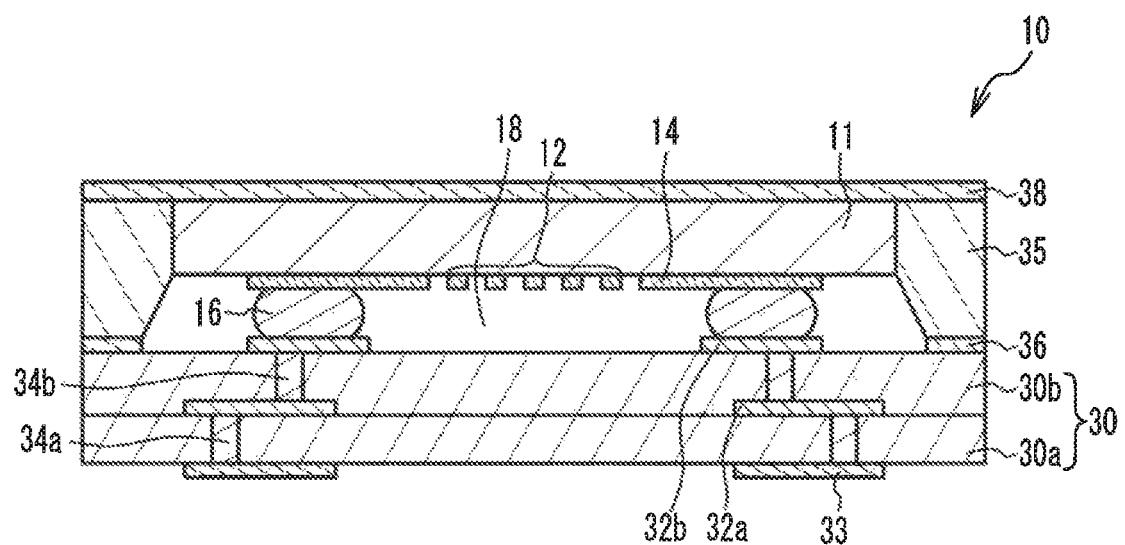
FIG. 4 is a cross-sectional view of an acoustic wave element in the first embodiment.

FIG. 4 is a cross-sectional view of an acoustic wave element in the first embodiment. As illustrated in FIG. 4, in the acoustic wave element 10, a substrate 11 is mounted on a wiring substrate 30. The wiring substrate 30 includes insulating layers 30a and 30b that are stacked. The insulating layers 30a and 30b are, for example, resin layers or ceramic layers. Wiring layers 32b and a ring-shaped metal layer 36 are located on the upper surface of the wiring substrate 30. Wiring layers 32a are located on the insulating layer 30a. Via wirings 34a and 34b respectively penetrating through insulating layers 30a and 30b are provided. The terminals 33 are located on the lower surface of the wiring substrate 30. The wiring layers 32a and 32b, the via wirings 34a and 34b, and the terminals 33 are formed of metal layers such as, but not limited to, copper layers, gold layers, aluminum layers, or nickel layers.

An acoustic wave resonator 12 and wiring lines 14 are located on the lower surface of the substrate 11. The acoustic wave resonator 12 is the acoustic wave resonator illustrated in FIG. 3A or FIG. 3B. The wiring lines 14 are formed of a metal layer such as, but not limited to, a copper layer, a gold layer, and an aluminum layer. The wiring lines 14 and the wiring layers 32b are bonded by bumps 16. The bumps 16 are metal bumps such as, but not limited to, gold bumps, copper bumps, or solder bumps. The substrate 11 is flip-chip mounted on the wiring substrate 30 with use of the bumps 16 such that the acoustic wave resonator 12 faces the wiring substrate 30 across an air gap 18. The terminals 33 are electrically connected to the acoustic wave resonator 12 through the via wirings 34a, the wiring layers 32a, the via wirings 34b, the wiring layers 32b, the bumps 16, and the wiring lines 14.

A sealing portion 35 is provided so as to surround the substrate 11. The lower surface of the sealing portion 35 is bonded to the ring-shaped metal layer 36. The sealing portion 35 is made of a metal such as, but not limited to, solder or an insulating material such as, but not limited to, resin. A lid 38 is located on the upper surfaces of the substrate 11 and the sealing portion 35. The acoustic wave element 10 may be a bare chip in which the acoustic wave resonator 12 is not sealed. The lid 38 is a metal plate or an insulator plate. In FIG. 2, the terminals 33 are connected to the terminals 25a and 25b of the circuit substrate 20 through the bumps 28.

Figure 5A:
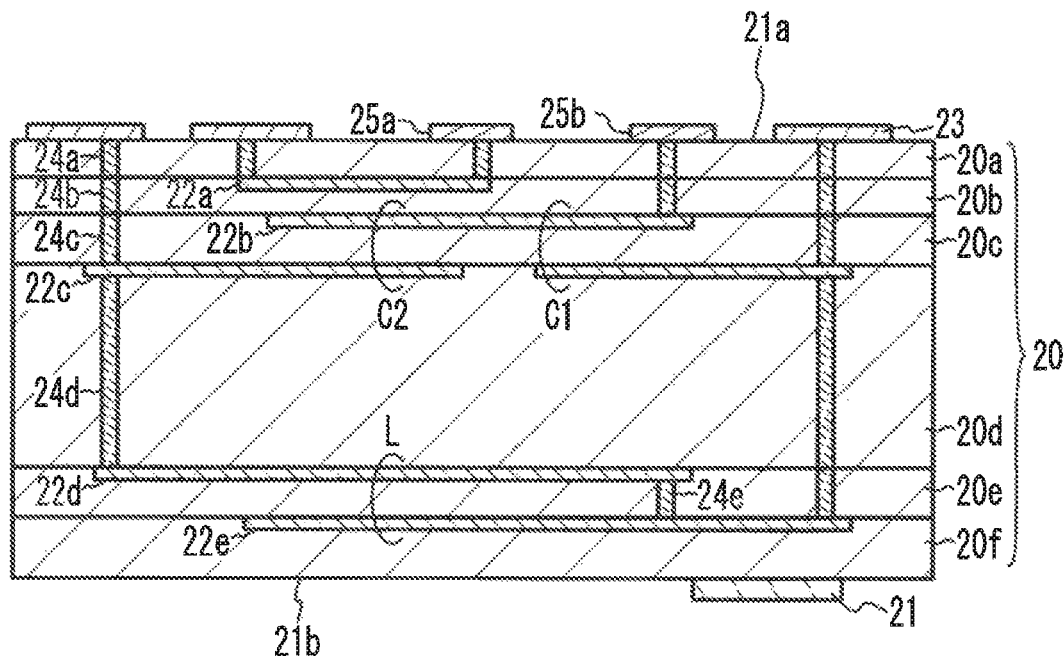
FIG. 5A and FIG. 5B are cross-sectional views (No. 1) illustrating a method of manufacturing a filter in accordance with the first embodiment.
Figure 5B:
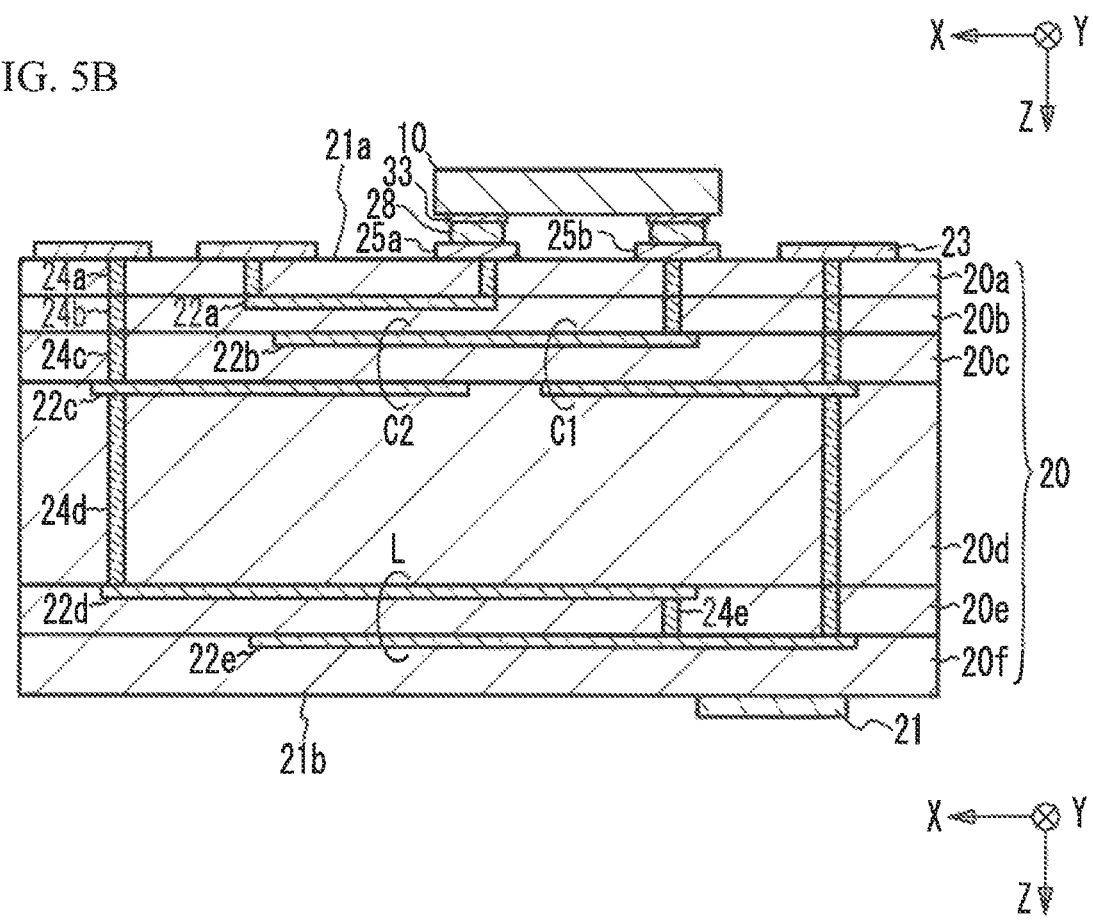

FIG. 5A through FIG. 6B are cross-sectional views illustrating a method of manufacturing the filter in accordance with the first embodiment. FIG. 5A through FIG. 6A are upside down views of FIG. 2. That is, the lower surface 21a of the circuit substrate 20 is illustrated at the upper side, and the upper surface 21b is illustrated at the lower side. As illustrated in FIG. 5A, the circuit substrate 20 is formed. As illustrated in FIG. 5B, the acoustic wave element 10 is mounted on the circuit substrate 20 by using the bumps 28. The bumps 28 are, for example, solder bumps.

Figure 6A:
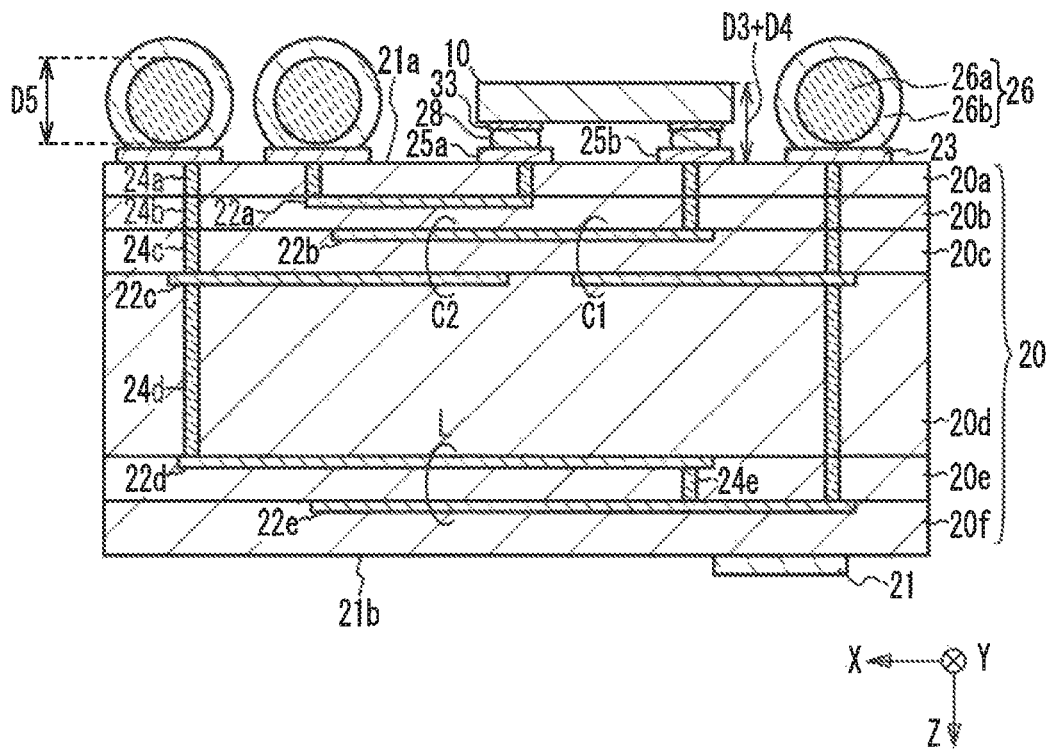
FIG. 6A and FIG. 6B are cross-sectional views (No. 2) illustrating the method of manufacturing the filter in accordance with the first embodiment.

As illustrated in FIG. 6A, the bumps 26 are formed on the terminals 23. The bump 26 includes a core 26a and an outer layer 26b covering the core 26a. The outer layer 26b is, for example, a solder layer, and is, for example, a tin silver solder layer. The core 26a is made of a metal or an insulating material having a melting point greater than the melting point of the outer layer 26b, and is made of, for example, copper. For example, when the outer layer 26b is made of tin silver, the melting point of the core 26a is 220° C. or greater. The height D5 of the core 26a is greater than D3+D4. The step of FIG. 5B and the step of FIG. 6A may be carried out in reverse order, or the step of FIG. 5B and the step of FIG. 6A may be simultaneously carried out. Through the above process, the filter of the first embodiment is completed.

Figure 6B:
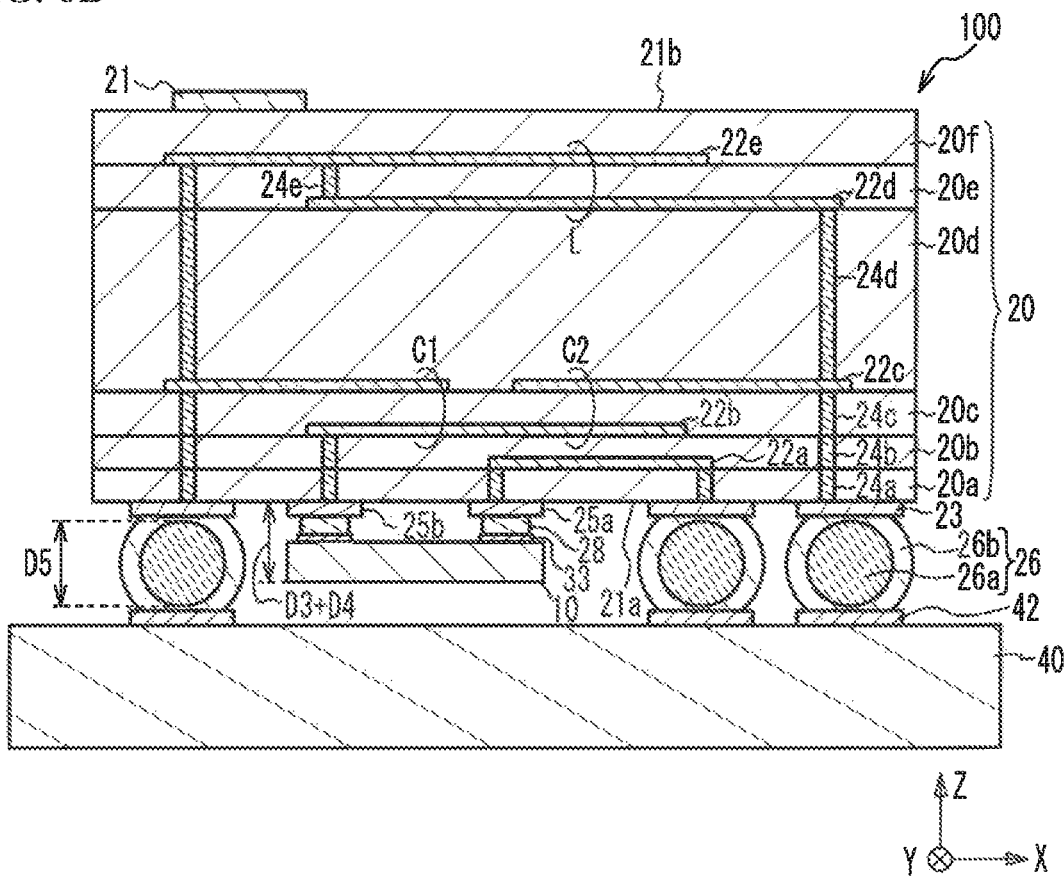

As illustrated in FIG. 6B, terminals 42 are located on the upper surface of a mounting board 40. The bumps 26 are bonded to the terminals 42. This process mounts the high-frequency device 100 on the mounting board 40. The cores 26a inhibit the lower surface of the acoustic wave element 10 from coming in contact with the mounting board 40.

First Comparative Example

Figure 7:
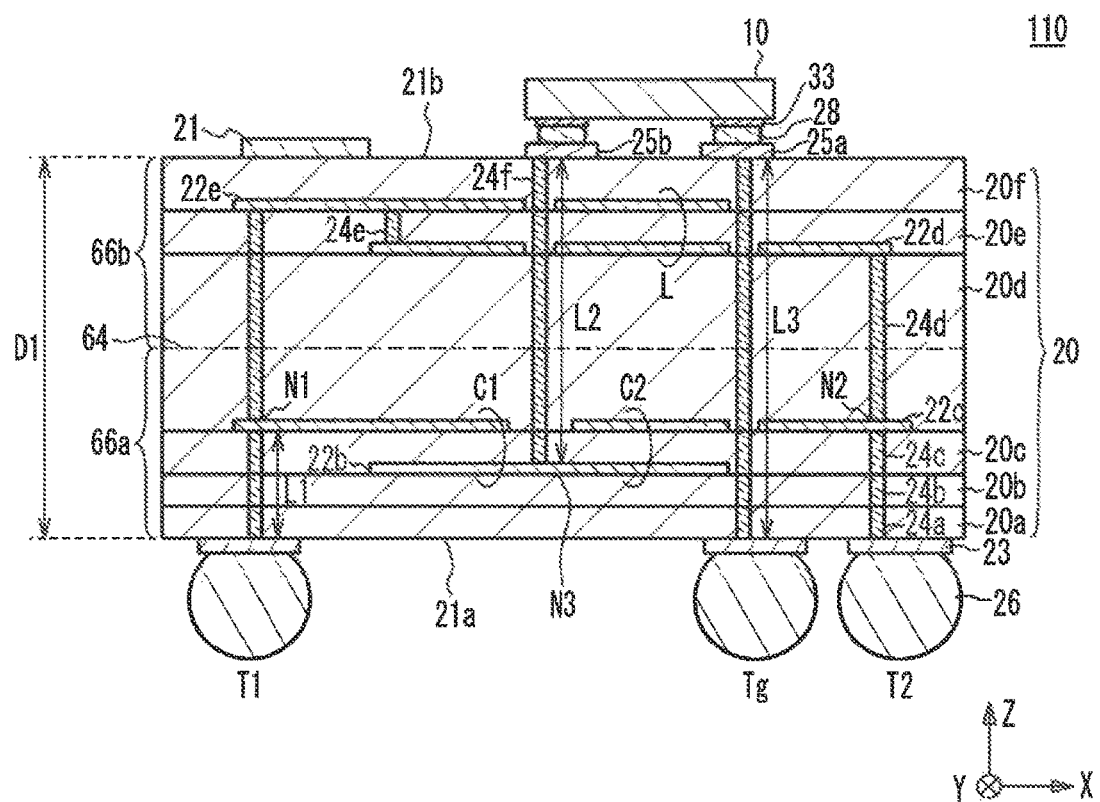
FIG. 7 is a cross-sectional view of a high-frequency device in accordance with a first comparative example.

FIG. 7 is a cross-sectional view of a high-frequency device in accordance with a first comparative example. As illustrated in FIG. 7, in a high-frequency device 110 in accordance with the first comparative example, the terminals 25a and 25b are located on the upper surface 21b of the circuit substrate 20. The acoustic wave element 10 is mounted on the upper surface 21b of the circuit substrate 20. The terminal 25b and the node N3 are electrically connected through via wirings 24c to 24f. The terminal 25a and the ground terminal Tg are electrically connected through the via wirings 24a to 24f. Other structures are the same as those of the first embodiment, and the description thereof is thus omitted.

In the first comparative example, the acoustic wave element 10 is located on the upper surface 21b opposite from the lower surface 21a on which the terminals 23 and the bumps 26 are located. Thus, when the circuit substrate 20 is mounted on the mounting board 40, a collet holding the circuit substrate 20 comes in contact with the acoustic wave element 10. Therefore, an object may come in contact with the acoustic wave element 10 from the above. This may break the acoustic wave element 10.

In the first embodiment, as illustrated in FIG. 2, the circuit substrate 20 includes the dielectric layers 20a to 20f and the wiring patterns 22a to 22e. The wiring patterns 22a to 22e are located on at least one of the dielectric layers 20a to 20f. One or more capacitors C1 and C2 and the inductor L (a passive element) are formed of at least one of the wiring patterns 22a to 22e. The terminals 23 and the bumps 26 (a terminal) are located on the lower surface 21a (a first surface) of the circuit substrate 20, and the terminals 23 are electrically connected to the capacitors C1 and C2 and the inductor L through the path L1 (a first path) in the circuit substrate 20. The acoustic wave element 10 is located on the lower surface 21a of the circuit substrate 20, and is electrically connected to the capacitors C1 and C2 and the inductor L through the path L2 (a second path) in the circuit substrate 20. Since the acoustic wave element 10 is located on the lower surface 21a, on which the terminals 23 are also located, of the circuit substrate 20, an object is inhibited from coming in contact with the acoustic wave element 10 from above.

The height D2 from the lower surface 21a of the circuit substrate 20 to the lower surface (the surface furthest away from the first surface) of the bump 26 in the Z direction is greater than the height D3+D4 from the lower surface 21*a* to the lower surface (the surface furthest away from the first surface) of the acoustic wave element 10. This structure inhibits the acoustic wave element 10 from coming in contact with the mounting board 40 and breaking when the high-frequency device 100 is mounted on the mounting board 40 as illustrated in FIG. 6B.

Furthermore, as illustrated in FIG. 6B, the bump 26 includes the outer layer 26*b* made of solder and the core 26*a* having a melting point greater than the melting point of solder and covered with the outer layer 26*b*. The height D5 of the core 26*a* in the Z direction is greater than the height D3+D4 from the lower surface 21*a* of the circuit substrate 20 to the lower surface of the acoustic wave element 10. This structure inhibits the acoustic wave element 10 from coming in contact with the mounting board 40 even when solder of the outer layer 26*b* is melted at the time of mounting the circuit substrate 20 on the mounting board 40.

In the first comparative example, since the acoustic wave element 10 is located on the upper surface 21*b* of the circuit substrate 20 as illustrated in FIG. 7, the direction identification mark 21 is poorly-visible. In the first embodiment, the direction identification mark 21 is located on the upper surface 21*b* of the circuit substrate 20 as illustrated in FIG. 2. Since the acoustic wave element 10 is not mounted on the upper surface 21*b* of the circuit substrate 20, the visibility of the direction identification mark 21 is improved. The direction identification mark 21 is a mark for identifying the orientation of the circuit substrate 20 when the circuit substrate 20 is viewed from above. For example, the terminal 23 closest to the direction identification mark 21 can be identified as a specific terminal.

As illustrated in FIG. 7, in the first comparative example, each of the length of the path L2 connecting the node N3 and the terminal 25*b* and the length of the path L3 connecting the terminal 25*a* and the ground terminal Tg is approximately the thickness D1 of the circuit substrate 20.

Figure 8:
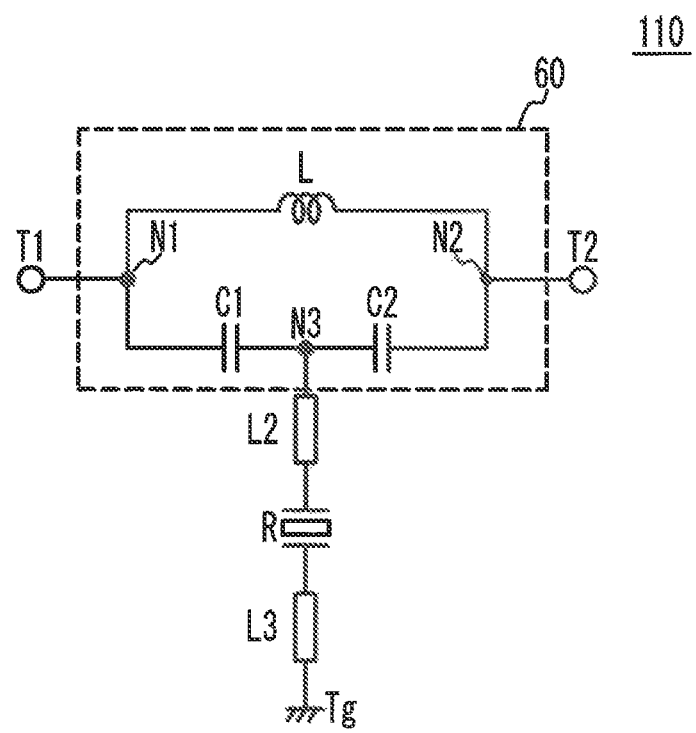
FIG. 8 illustrates an equivalent circuit of the high-frequency device in accordance with the first comparative example.

FIG. 8 illustrates an equivalent circuit of the high-frequency device in accordance with the first comparative example. As illustrated in FIG. 8, in the first comparative example, the path L2 is connected between the node N3 and the acoustic wave resonator R, and the path L3 is connected between the acoustic wave resonator R and the ground terminal Tg.

Figure 9A:
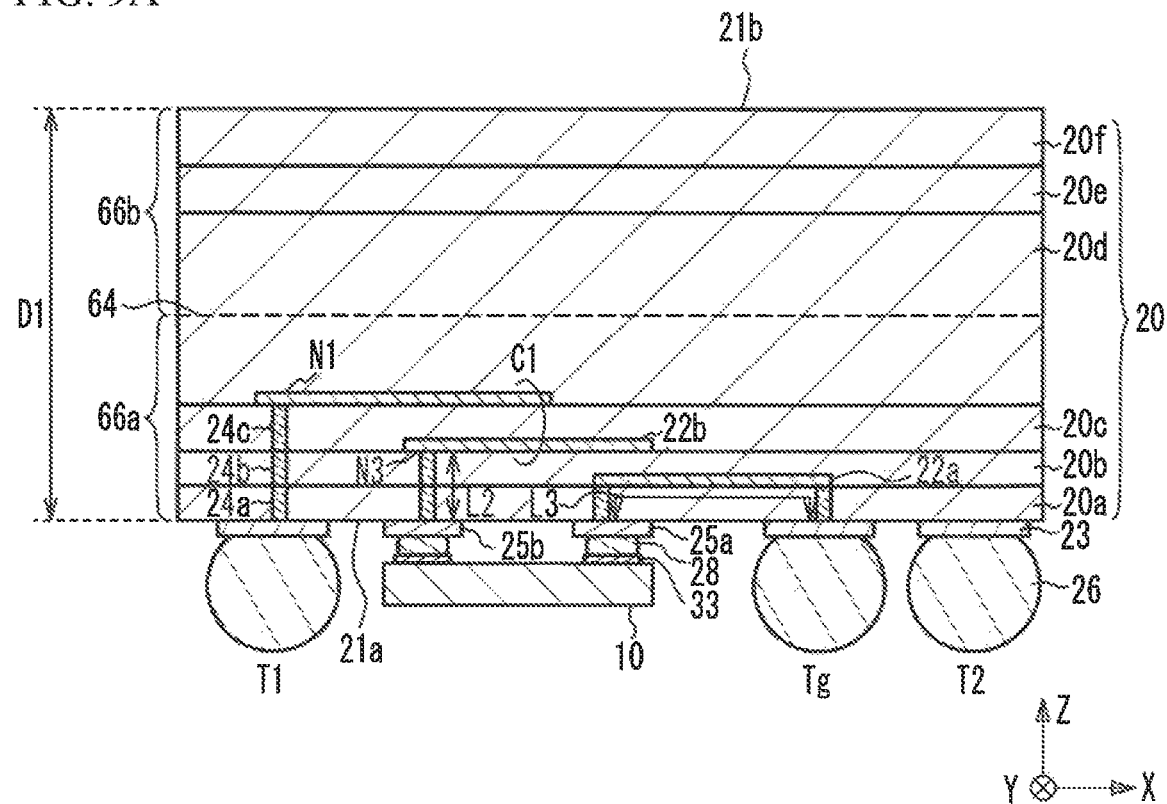
FIG. 9A is a cross-sectional view of the high-frequency device in accordance with the first embodiment.
Figure 9B:
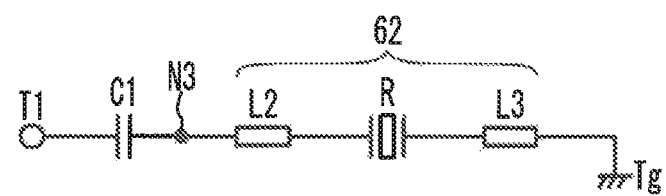
FIG. 9B illustrates an equivalent circuit of the high-frequency device in accordance with the first embodiment.

To examine the influence of the paths L2 and L3, the capacitor C1 and the acoustic wave resonator R are considered. FIG. 9A is a cross-sectional view of the high-frequency device in accordance with the first embodiment, and FIG. 9B illustrates an equivalent circuit of the high-frequency device in accordance with the first embodiment. As illustrated in FIG. 9A and FIG. 9B, the capacitor C1 and the acoustic wave resonator R are connected in series between the terminal T1 and the ground terminal Tg. The capacitor C1 is located in the region 66*a* that is located lower than the center 64 in the Z direction of the circuit substrate 20. This is because, when the inductor L is located in the region 66*a*, the distance between the inductor L and the metal layer of the mounting board 40 decreases, and the Q-value of the inductor L decreases due to eddy-current loss. Provision of the capacitor C2 in the region 66*a* reduces the lengths of the path L2 between the node N3 and the terminal 25*b* and the path L3 between the terminal 25*a* and the ground terminal Tg.

Figure 10A:
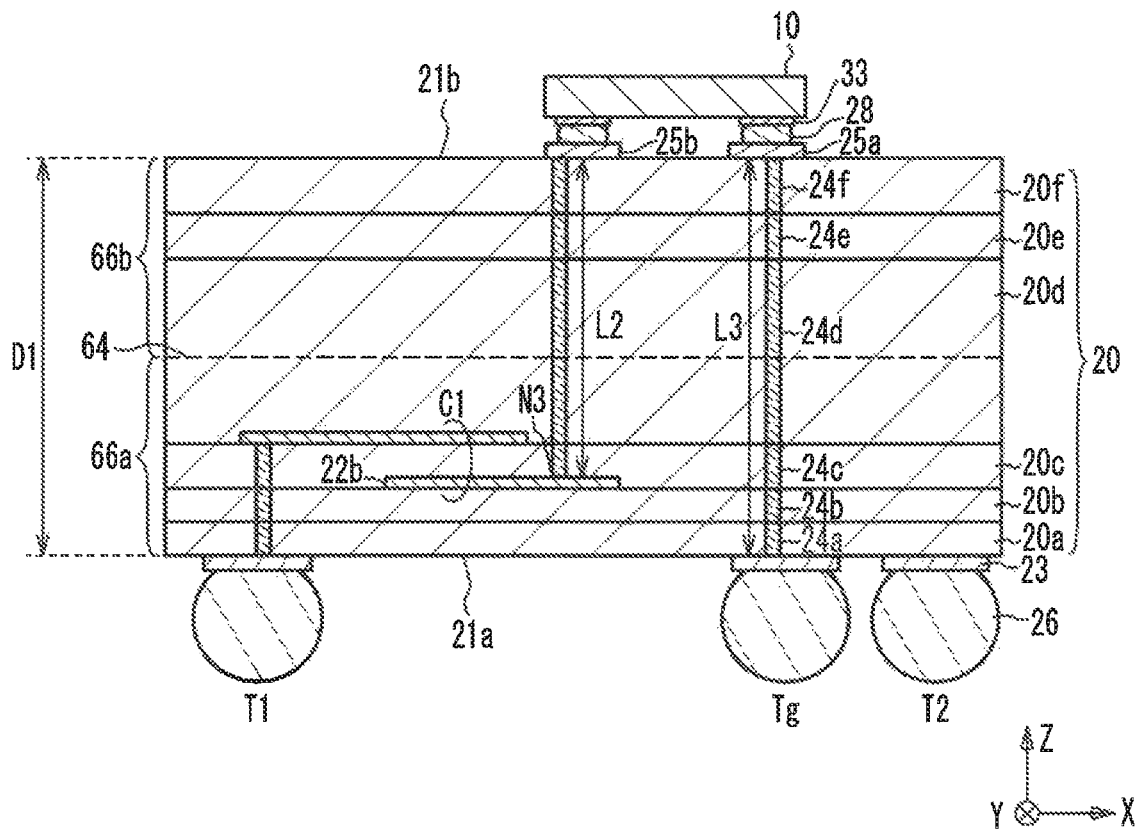
FIG. 10A is a cross-sectional view of the high-frequency device in accordance with the first comparative example.
Figure 10B:
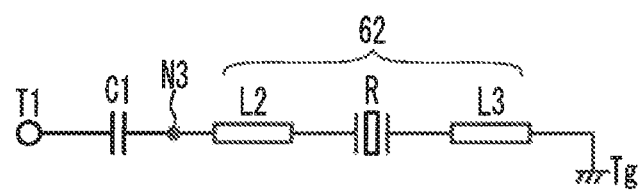
FIG. 10B illustrates an equivalent circuit of the high-frequency device in accordance with the first comparative example.

FIG. 10A is a cross-sectional view of the high-frequency device in accordance with the first comparative example, and FIG. 10B illustrates an equivalent circuit of the high-frequency device in accordance with the first comparative example. As illustrated in FIG. 10A and FIG. 10B, the length of the path L2 is equal to or greater than one-half of the thickness D1 of the circuit substrate 20, and the length of the path L3 is equal to or greater than the thickness D1.

As illustrated in FIG. 9B and FIG. 10B, the acoustic wave resonator R and the paths L2 and L3 form a series resonant circuit 62. The resonant frequency f0 of the series resonant circuit 62 is $f0=1/(2\pi\sqrt{L0 \times C0})$. L0 represents the inductance of the paths L2 and L3, and C0 represents the capacitance of the acoustic wave resonator R. The capacitance C0 is, for example, 1 pF to 3 pF. As the inductance of the paths L2 and L3 increases, the resonant frequency f0 decreases.

Figure 11:
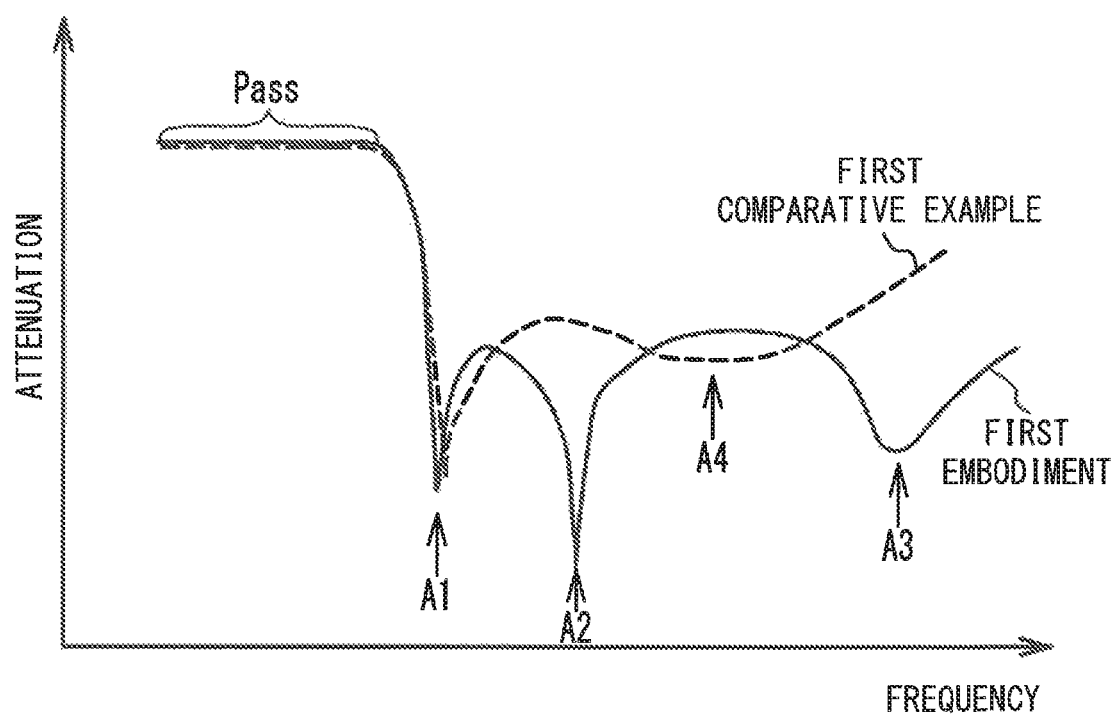
FIG. 11 is a schematic view of transmission characteristics of the first embodiment and the first comparative example.

FIG. 11 is a schematic view of transmission characteristics of the first embodiment and the first comparative example. As illustrated in FIG. 11, in the first embodiment, attenuation poles A1 to A3 are formed at frequencies higher than the passband Pass. The attenuation pole A1 is formed mainly by the resonant frequency of the acoustic wave resonator R. The attenuation pole A2 is formed mainly by the resonant circuit 60. The attenuation pole A3 is formed mainly by the resonant frequency f0 of the series resonant circuit 62. The stopband higher than the passband Pass in frequency is widened by forming three attenuation poles A1 to A3.

In the first comparative example, since the paths L2 and L3 are long, the inductance of the paths L2 and L3 increases, and the resonant frequency f0 of the series resonant circuit 62 thereby lowers. Thus, the attenuation poles A2 and A3 are combined and form an attenuation pole A4. This narrows the stopband. In the first embodiment, the paths L2 and L3 are shortened by mounting the acoustic wave element 10 on the lower surface 21*a*. Thus, the stopband is widened.

In the first embodiment, a first end of the capacitor C1 (a first capacitor) is electrically connected to the terminal T1 (a first signal terminal) through the first path L1. A second end of the capacitor C1 is electrically connected to a first end of the acoustic wave resonator R through the path L2. A second end of the acoustic wave resonator R is electrically connected to the ground terminal Tg through the path L3 (a third path) in the circuit substrate 20. This structure shortens the paths L2 and L3 as illustrated in FIG. 9A and FIG. 9B.

In the first embodiment, the total length of the paths L2 and L3 is less than the sum of the thickness D1 of the circuit substrate 20 and the distance between the second end of the capacitor C1 and the upper surface 21*b* (a second surface) of the circuit substrate 20. This configuration allows the total length of the paths L2 and L3 to be less than that of the first comparative example.

A first end of the capacitor C2 (a second capacitor) is electrically connected to the second end of the capacitor C1 and the first end (i.e., the node N3) of the acoustic wave resonator R. A second end of the capacitor C2 is electrically connected to the terminal T2 (a second signal terminal). The inductor L is connected in parallel to the capacitor C1 and the capacitor C2 in the path between the terminals T1 and T2. This structure achieves a low-pass filter and a high-pass filter. The stopband of the filter is widened.

The acoustic wave resonator R, the capacitors C1 and C2, and the inductor L form a low-pass filter. As illustrated in FIG. 11, the resonant frequency of the acoustic wave resonator is higher than the passband Pass of the low-pass filter. This configuration makes the transition region between the passband and the stopband steep.

As illustrated in FIG. 11, the resonant frequency f0 of the series resonant circuit 62 formed by the paths L1 and L2 of the acoustic wave resonator R is higher than the resonant frequency of the acoustic wave resonator R. This configuration widens the stopband.

The attenuation pole A2 due mainly to the resonant circuit 60 is preferably located between the attenuation pole A1 due mainly to the resonant frequency of the acoustic wave resonator R and the attenuation pole A3 due mainly to the resonant frequency f0 of the series resonant circuit 62. This configuration widens the stopband of the low-pass filter. Therefore, the resonant frequency f0 is inhibited from shifting to a lower frequency to combine the attenuation poles A2 and A3 as the lengths of the paths L2 and L3 increase as in the first comparative example.

The capacitor may be located in the region 66b, and the inductor may be located in the region 66a. However, to improve the Q-value of the inductor L, one or more inductors L are preferably located in the region 66b (a second region), and one or more capacitors C1 and C2 are preferably located in the region 66a (a first region). In the first embodiment and the first comparative example, the capacitors C1 and C2 are electrically connected to the acoustic wave resonator R through the path L2, and the inductor L is electrically connected to the acoustic wave resonator R only through the capacitors C1 and C2. In this case, in the first comparative example, the paths L2 and L3 pass through the dielectric layers 20d to 20f provided with the inductor L as illustrated in FIG. 7. The diameters of the via wirings 24a to 24f are, for example, 10 μm to 120 μm. It is impossible to provide the wiring patterns 22a to 22e in the region around the via wirings 24a to 24f. The diameter of the region is 110 μm to 200 μm. Thus, in the first comparative example, the planar area in which the wiring patterns 22d and 22e can be provided decreases, and the high-frequency device 110 thereby increases in size. In the first embodiment, since the paths L2 and L3 do not pass through the dielectric layers 20d to 20f, the planar area in which the wiring patterns 22d and 22e can be provided increases, and the high-frequency device 110 is reduced in size.

First Variation of the First Embodiment

Figure 12:
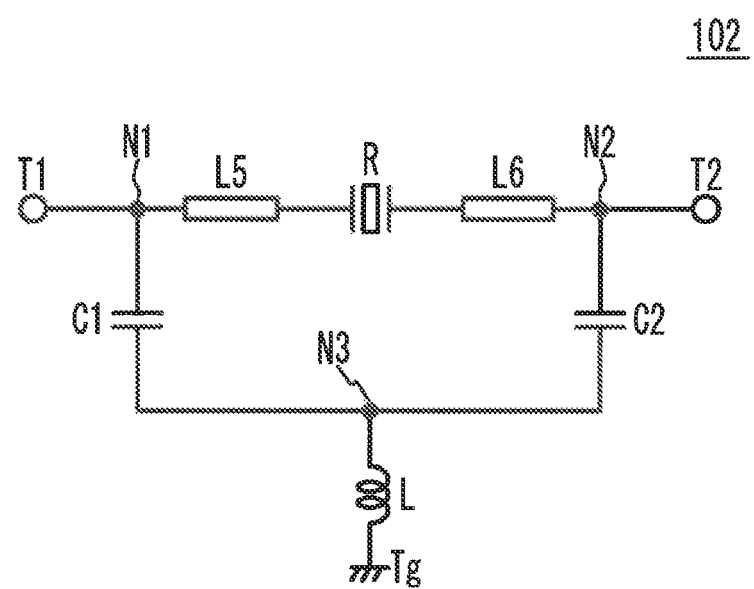
FIG. 12 is a circuit diagram of a high-frequency device in accordance with a first variation of the first embodiment.

FIG. 12 is a circuit diagram of a high-frequency device in accordance with a first variation of the first embodiment. As illustrated in FIG. 12, in a high-frequency device 102, the acoustic wave resonator R is connected between the terminals T1 and T2. The capacitors C1 and C2 are connected in parallel to the acoustic wave resonator R between the node N1, which is located between the acoustic wave resonator R and the terminal T1, and the node N2, which is located between the acoustic wave resonator R and the terminal T2. The capacitors C1 and C2 are connected in series with each other between the nodes N1 and N2. The Inductor L is connected between the node N3, which is located between the capacitors C1 and C2, and the ground terminal Tg. A path L5 is formed between the acoustic wave resonator R and the node N1, and a path L6 is formed between the acoustic wave resonator R and the node N2. Other structures are the same as those of the first embodiment, and the description thereof is thus omitted.

For example, the capacitances of the capacitors C1 and C2 are configured to be 0.2 pF, the inductance of the inductor L is configured to be 9.1 nH, the resonant frequency of the acoustic wave resonator R is configured to be 2.26 GHz, and the antiresonant frequency of the acoustic wave resonator R is configured to be 2.33 GHz. This configuration causes the high-frequency device 102 to function as a low-pass filter having a passband that is a frequency band lower than the resonant frequency.

For example, the capacitances of the capacitors C1 and C2 are configured to be 0.4 pF, the inductance of the inductor L is configured to be 8.2 nH, the resonant frequency of the acoustic wave resonator R is configured to be 2.26 GHz, and the antiresonant frequency of the acoustic wave resonator R is configured to be 2.33 GHz. This configuration causes the high-frequency device 100 to function as a high-pass filter having a passband that is a frequency band higher than the resonant frequency.

In the first variation of the first embodiment, the lengths of the paths L5 and L6 are shortened. As in the first variation of the first embodiment, when the acoustic wave resonator R is connected between the terminals T1 and T2, the capacitance of the acoustic wave resonator R may be small according to the requirements on the circuit characteristics. Thus, even when the paths L5 and L6 are long, this does not affect the characteristics as much as in the first embodiment.

In the first embodiment and the first variation thereof, it is sufficient if the passive element is at least one of the capacitor and the inductor. The resonant frequency of the acoustic wave resonator R is located outside the passband of the filter. This configuration increases the steepness between the passband and the stopband. The resonant frequency of the acoustic wave resonator R may be located in the passband. The resonant frequency of the acoustic wave resonator R is, for example, 0.7 GHz to 100 GHz, preferably 0.7 GHz to 10 GHz.

Second Variation of the First Embodiment

Figure 13A:
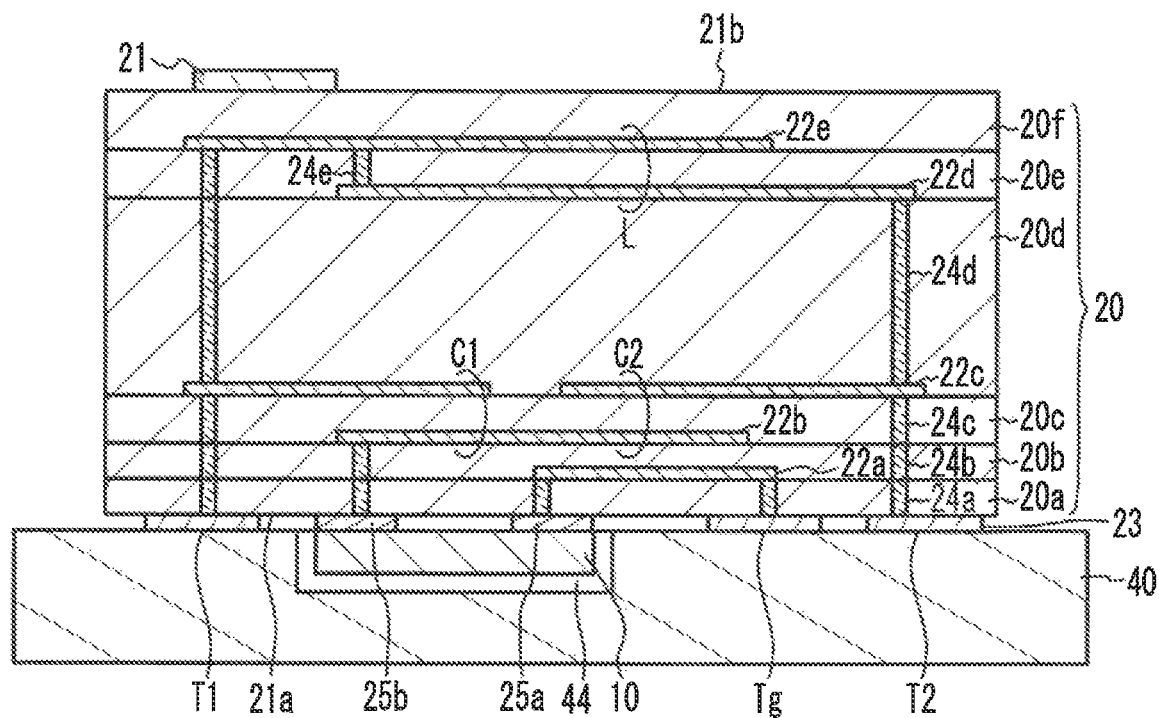
FIG. 13A and FIG. 13B are a cross-sectional view and a plan view in which a high-frequency device in accordance with a second variation of the first embodiment is mounted on a mounting board, respectively.
Figure 13B:
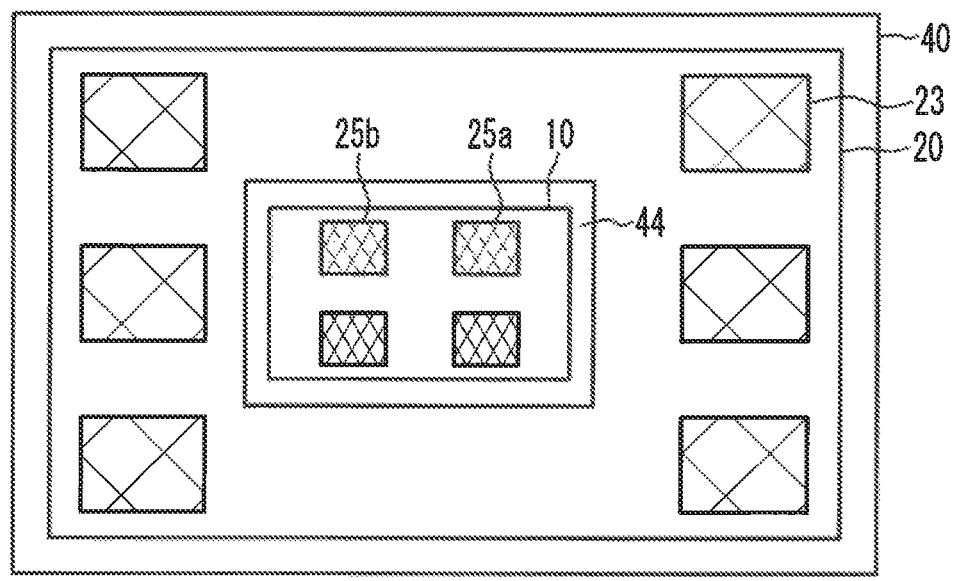

FIG. 13A and FIG. 13B are a cross-sectional view and a plan view in which a high-frequency device in accordance with a second variation of the first embodiment is mounted on a mounting board. The dimensions and arrangements do not match between the cross-sectional view and the plan view. As illustrated in FIG. 13A and FIG. 13B, no bump is provided to the terminals 23, 25a, and 25b. A recessed portion 44 is located on the upper surface of the mounting board 40. The acoustic wave element 10 fits inside the recessed portion 44. Other structures are the same as those of the first embodiment, and the description thereof is thus omitted.

Third Variation of the First Embodiment

Figure 14:
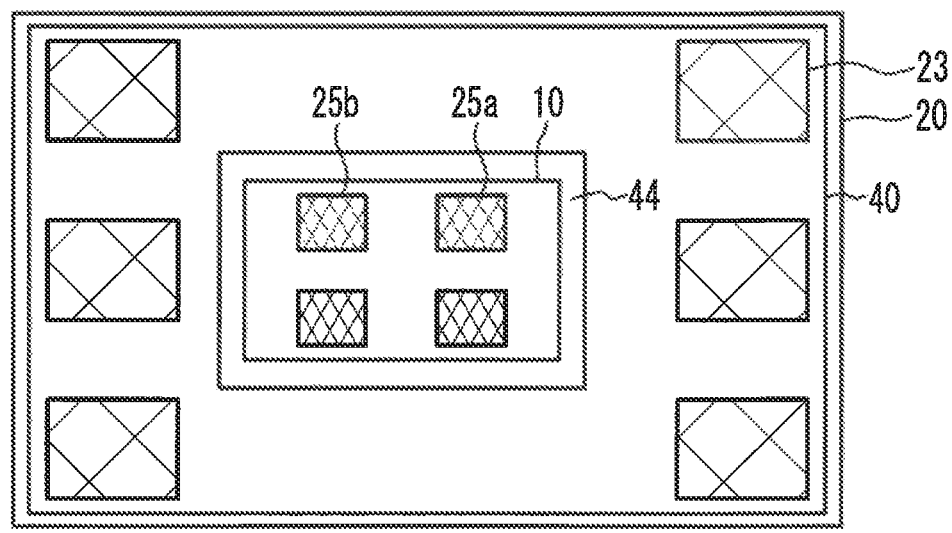
FIG. 14 is a plan view in which a high-frequency device in accordance with a third variation of the first embodiment is mounted on a mounting board.

FIG. 14 is a plan view in which a high-frequency device in accordance with a third variation of the first embodiment is mounted on a mounting board. As illustrated in FIG. 14, the mounting board 40 has the same size as the circuit substrate 20 or smaller than the circuit substrate 20. Other structures are the same as those of the second variation of the first embodiment, and the description thereof is thus omitted.

As in the second and third variations of the first embodiment, the height of the terminal 23 may be lower than the acoustic wave element 10.

Second Embodiment

Figure 15:
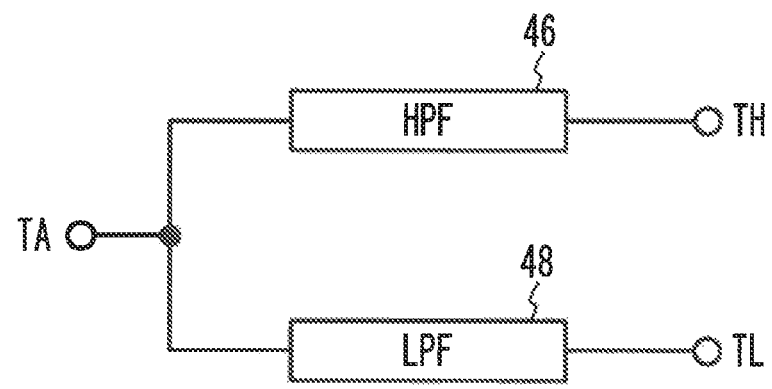
FIG. 15 is a circuit diagram of a diplexer in accordance with a second embodiment.

FIG. 15 is a circuit diagram of a diplexer in accordance with a second embodiment. As illustrated in FIG. 15, a high-pass filter 46 is connected between a common terminal TA and a terminal TH. A low-pass filter 48 is connected between the common terminal TA and a terminal TL. The high-pass filter transmits signals in the passband to the terminal TH or the common terminal TA among high-frequency signals input from the common terminal TA or the terminal TH, and suppresses signals with other frequencies. The low-pass filter 48 transmits signals in the passband to the terminal TL or the common terminal TA among high-frequency signals input from the common terminal TA or the terminal TL, and suppresses signals with other frequencies. A bandpass filter may be used instead of at least one of the high-pass filter 46 and the low-pass filter 48. At least one of the high-pass filter 46 and the low-pass filter 48 can be the high-frequency device according to any one of the first embodiment and the variations thereof.

A diplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A high-frequency device comprising:
a circuit substrate including dielectric layers that are stacked, wiring patterns located on at least one of the dielectric layers, and a passive element formed of at least one of the wiring patterns, the circuit substrate having a first surface that is a surface of an outermost dielectric layer in a stacking direction of the dielectric layers;
a terminal for connecting the high-frequency device to an external circuit, the terminal being located on the first surface and electrically connected to the passive element through a first path in the circuit substrate;
an acoustic wave element located on the first surface and electrically connected to the passive element through a second path in the circuit substrate, and
a ground terminal located on the first surface,
wherein
the terminal is a first signal terminal,
the passive element includes a first capacitor that is located in a first region of the circuit substrate, the first region being located closer to the first surface than a center in the stacking direction of the circuit substrate,
the acoustic wave element includes an acoustic wave resonator,
a first end of the first capacitor is electrically connected to the first signal terminal through the first path,
a second end of the first capacitor is electrically connected to a first end of the acoustic wave resonator through the second path, and
a second end of the acoustic wave resonator is electrically connected to the ground terminal through a third path in the circuit substrate.

2. The high-frequency device according to claim 1, wherein
a total length of the second path and the third path is less than a sum of a thickness of the circuit substrate and a distance between the second end of the first capacitor and a second surface of the circuit substrate, the second surface being an opposite surface of the circuit substrate from the first surface.

3. The high-frequency device according to claim 1, further comprising
a second signal terminal located on the first surface, wherein
the passive element includes a second capacitor located in the first region and an inductor located in a second region of the circuit substrate, the second region being located closer to a second surface of the circuit substrate than the center in the stacking direction of the circuit substrate, the second surface being an opposite surface of the circuit substrate from the first surface,
a first end of the second capacitor is electrically connected to the second end of the first capacitor and the first end of the acoustic wave resonator,
a second end of the second capacitor is electrically connected to the second signal terminal, and
the inductor is connected in parallel to the first capacitor and the second capacitor in a path between the first signal terminal and the second signal terminal.

4. The high-frequency device according to claim 3, wherein
the acoustic wave resonator, the first capacitor, the second capacitor, and the inductor form a low-pass filter, and
a resonant frequency of the acoustic wave resonator is higher than a passband of the low-pass filter.

5. The high-frequency device according to claim 4, wherein
a resonant frequency of a resonant circuit formed of the acoustic wave resonator, the second path, and the third path is higher than a resonant frequency of the acoustic wave resonator.

6. The high-frequency device according to claim 1, further comprising
a direction identification mark located on a second surface that is an opposite surface of the circuit substrate from the first surface.

7. A multiplexer comprising:
the high-frequency device according to claim 1.

8. A high-frequency device comprising:
a circuit substrate including dielectric layers that are stacked, wiring patterns located on at least one of the dielectric layers, and a passive element formed of at least one of the wiring patterns, the circuit substrate having a first surface that is a surface of an outermost dielectric layer in a stacking direction of the dielectric layers;
a terminal for connecting the high-frequency device to an external circuit, the terminal being located on the first surface and electrically connected to the passive element through a first path in the circuit substrate; and
an acoustic wave element located on the first surface and electrically connected to the passive element through a second path in the circuit substrate,
wherein
the passive element includes a capacitor located in a first region and an inductor located in a second region, the first region being located closer to the first surface of the circuit substrate than a center in the stacking direction of the circuit substrate, the second region being located closer to a second surface of the circuit substrate than the center of the circuit substrate, the second surface being an opposite surface of the circuit substrate from the first surface,
the capacitor is electrically connected to the acoustic wave element through the second path, and
the inductor is electrically connected to the acoustic wave element through the capacitor.

9. A multiplexer comprising:
the high-frequency device according to claim 8.

10. A high-frequency device comprising:
a circuit substrate including dielectric layers that are stacked, wiring patterns located on at least one of the dielectric layers, and a passive element formed of at least one of the wiring patterns, the circuit substrate having a first surface that is a surface of an outermost dielectric layer in a stacking direction of the dielectric layers;

a terminal for connecting the high-frequency device to an external circuit, the terminal being located on the first surface and electrically connected to the passive element through a first path in the circuit substrate; and an acoustic wave element located on the first surface and electrically connected to the passive element through a second path in the circuit substrate, wherein a height from the first surface to a surface furthest away from the first surface of the terminal in the stacking direction is greater than a height from the first surface to a surface furthest away from the first surface of the acoustic wave element.

11. The high-frequency device according to claim 10, wherein the terminal includes an outer layer made of solder, and a core having a melting point greater than a melting point of solder and covered with the outer layer, and a width of the core in the stacking direction is greater than a height from the first surface to the surface furthest away from the first surface of the acoustic wave element.

12. A multiplexer comprising:

the high-frequency device according to claim 10.

* * * * *